(12) United States Patent  
Chen et al.

(10) Patent No.: US 6,525,940 B1  
(45) Date of Patent: Feb. 25, 2003

(54) INTEGRATED APPARATUS FOR THERMAL DISSIPATION

(75) Inventors: Daniel M. R. Chen, Taipei Hsien (TW); Tom C. L. Chen, Taipei Hsien (TW); Chi Ching Shou, Taipei (TW); Ming-Hui Lai, Taipei Hsien (TW)

(73) Assignee: Leadtek Research Inc., Taipei Hsien (TW)

( * ) Notice: Subject to any disclaimer, the term of this patent is extended or adjusted under 35 U.S.C. 154(b) by 0 days.

(21) Appl. No.: 10/004,667

(22) Filed: Dec. 4, 2001

(51) Int. Cl.⁷ .................................................. H05K 7/20
(52) U.S. Cl. ...................... 361/697; 165/80.3; 257/722; 361/719
(58) Field of Search ........................ 454/184; 415/213.1, 415/214.1; 165/121–126, 80.3, 185; 174/16.3; 257/722, 718, 719, 726, 727; 361/695, 697, 703, 704, 705, 717–719

(56) References Cited

U.S. PATENT DOCUMENTS

| | | | | |
|---|---|---|---|---|
| 5,138,523 A | * | 8/1992 | Benck et al. ................ | 361/687 |
| 5,304,735 A | * | 4/1994 | Earl et al. ................... | 174/16.3 |
| 5,835,347 A | * | 11/1998 | Chu ............................. | 361/697 |
| 5,927,385 A | * | 7/1999 | Yeh ............................. | 165/80.3 |
| 5,940,269 A | * | 8/1999 | Ko et al. ..................... | 361/697 |
| 6,385,047 B1 | * | 5/2002 | McCullough et al. ....... | 361/704 |

* cited by examiner

Primary Examiner—Gerald Tolin  
(74) Attorney, Agent, or Firm—J.C. Patents

(57) ABSTRACT

An integrated apparatus for thermal dissipation suitable for the thermal dissipation of the display chip and the memory chip on a display card. It comprises a baseboard, which contains the first side and the second side. The sets of first and second fins are located on the first side in which the first set is perpendicular to the first side and the second set forms an angle other than 90 degrees with the first side. The second side is in contact with both the display chip and the memory chip. A board hook is located on one side of baseboard that clamps on the edge of the display card. As well as, a fan is located on the first side between the sets of first and second fins.

15 Claims, 3 Drawing Sheets

INTEGRATED APPARATUS FOR THERMAL DISSIPATION

BACKGROUND OF THE INVENTION

1. Field of Invention

The invention relates to an apparatus for thermal dissipation. More particularly, the present invention relates to the integrated apparatus for thermal dissipation simultaneously for both the display chip and memory chip on a display card.

2. Description of the Related Art

Inside a computer system, the display card plays a vital role as the interface between the computer and the user because many important information and functions require the need of the display card and screen to greatly enhance its performance to help user solve his/her problem. From the early stage of monochrome display cards to nowadays 3D graphics accelerated display cards, the development for faster and more powerful display cards is a result of the critical demand from computer users. Looking back at the development of display cards, as computer functions become more powerful display cards have been accordingly developed from plain text display to graphic display. Moreover display has been developed from monochrome (black and white) to color and now multi-color 3D display to satisfy the user's visual experience. Due to the development of display technology, different interfaces have been introduced since the beginning from ISA bus (Industry Standard Architecture bus), VESA Local Bus (Video Electronic Standard Association bus), PCI bus (Peripheral Component Interconnect bus), to the latest AGP bus (Advanced/Accelerated Graphics Port bus). By the development of the above interfaces, the problem of data flow bottleneck at the interface can be solved and large amount of data can be transferred.

However, when display cards increase their work load associating with more memory device to process heavy data calculations for rendering complex graphics, the display chip and memory chip generate a significant amount of heat, which very possibly affect the performance of the entire system due to over-high temperature. For improving thermal dissipation of the display chip, memory chips, and other electronic components, conventions used various heat sinks devices located on the heat generating components. These heat sinks are usually made of high thermal conductive material so the heat can diffuse transversely to improve thermal dissipation. The selection of material for the heat sink on the properties of thermal conductivity and thermal expansion, the glue, the adhesive strength of the glue, and the characteristics of thermal diffusion direction have to be considered. From the diffusion of the heat generating components to finally the convection off the fins, the thermal resistance in the path has to be carefully calculated in order to design the most suitable thermal dissipation method. Especially in high thermal intensity devices, the adhesive method will greatly affect thermal dissipation due to the thermal coefficient of the glue.

Conventional apparatus for thermal dissipation used in display card is a combination of two heat sinks: one for the display chip and one for memory chip. In FIG. 1, this assembled apparatus for thermal dissipation includes a main heat sink 200, a second heat sink 300, and a fan 400. The main heat sink 200 is used to carry away the heat generated from the display chip 110 and is secured directly on the display chip 110 either by a screw or a buckling structure (not shown) onto the display card 100. The second heat sink 300 is used to carry away the heat generated by the memory chip 120. The fan 400 is located in the center of the main heat sink 200 and its wind carries away the surface heat of the heat sink, which improves thermal dissipation.

The second heat sink 300 does not have any buckling structure so it has to be glued on the memory chip 120 by thermal conductive epoxy. The thermal conductive epoxy requires a long time for curing and moreover the second heat sink 300 needs to be installed before the main heat sink 200 is assembled, therefore this assembled apparatus for thermal dissipation requires tedious procedures that waste time and labor. Furthermore, because the display card 100 has board bending issues, the thickness of the thermal conductive epoxy might not be enough for some part of the second heat sink 300 and causing the second heat sink 300 to detach due to vibration during transportation. Moreover there is no fin on the second heat sink 300 so overall surface area is small and yet it is not connected to the main heat sink 200 so thermal dissipation is poor. Further still, the fins 210 on the main heat sink 200 are perpendicular providing a comparatively small surface area for thermal dissipation so it also affects thermal dissipation.

In the above description, the conventional heat sinks are not easily assembled and are easily detached. Furthermore, the performance of thermal dissipation of this assembled apparatus for thermal dissipation of display and memory devices is comparatively worse.

SUMMARY OF THE INVENTION

This invention provides an integrated apparatus for thermal dissipation suitable for thermal dissipation of the display chip and the memory chip on a display card by integrating the different heat sinks found in conventions to improve thermal dissipation and reduce labor time. Moreover, a board hook is added to prevent detachment due to vibration.

According to the objective, this invention provides an integrated apparatus for thermal dissipation suitable for thermal dissipation of the display chip and the memory chip on a display card. The integrated apparatus for thermal dissipation comprises a baseboard, a set of first fins, a set of second fins, a board hook, and a fan. The baseboard contains a first side and an opposite second side. The set of first and the set of second fins are located on the first side in which the set of first fins is perpendicular to the first side and the set of second forms an angle other than 90 degrees with the first side. The second side is in contact with both the display chip and the memory chip. Furthermore, a board hook is located on one side of baseboard that clamps on the edge of the display card. A fan is located on the first side between the sets of first and second fins.

According to the objective, the integration of the display chip and memory chip heat sink, by having one unit replacing the assembled unit, can improve the inconvenience of assembly and thermal dissipation.

According to the objective, the set of second fins has a slant design, which increases surface area for thermal dissipation for improving thermal dissipation.

According to the objective, a board hook is added onto one side of the heat sink to attach the display card's PCB board for reducing the gap between the heat generating component (display card and memory card) and the heat sink. Moreover the board hook prevents bad contact between the heat generating components and heat sink due to bending of the display card's PCB board. Furthermore, the board hook eliminates the thermal conducting epoxy adhesive method for preventing detachment due to vibration and lessening labor time on the installation of the heat sink.

According to the objective, the board hook has a slanted edge for simplifying the worker's installation and preventing the separation of the heat sink and the PCB board of the display card.

According to the objective, the active type fan is located in the center of the heat sink to carry away the surface heat of the heat sink to improve thermal dissipation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
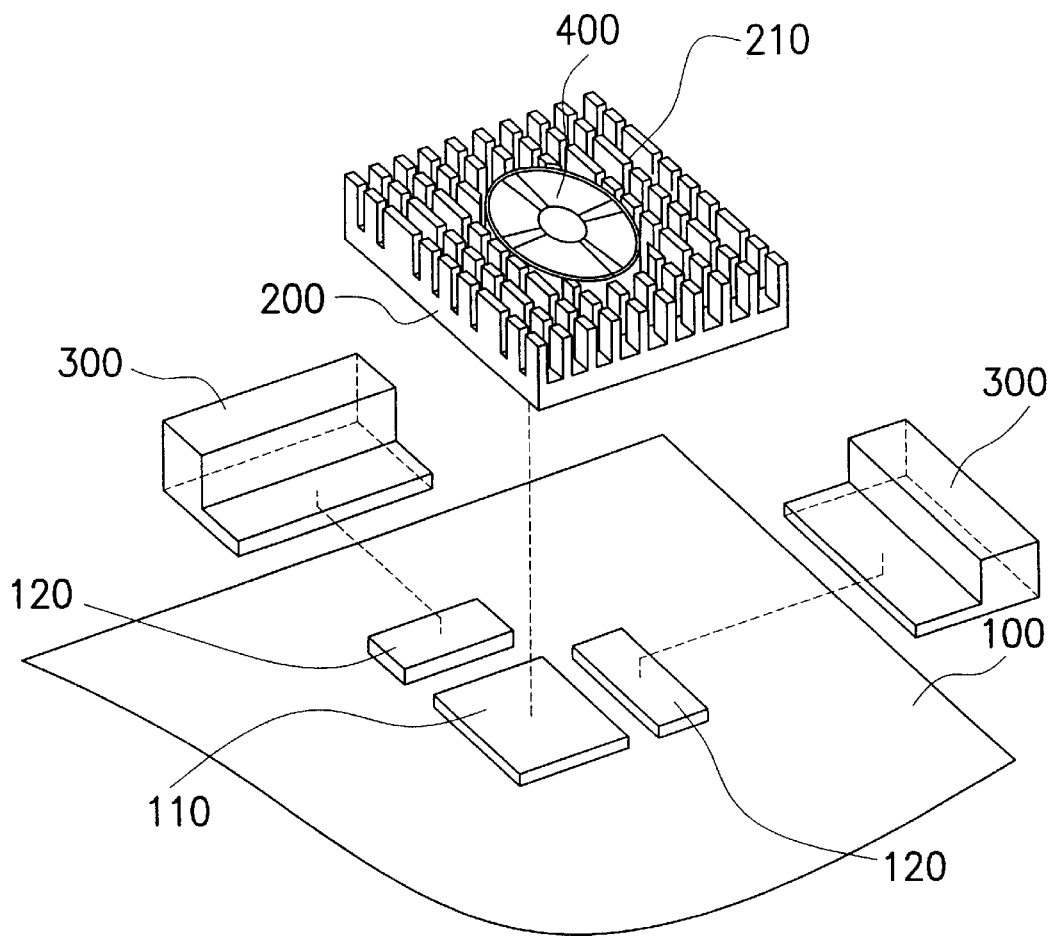
FIG. 1 is a schematic drawing of a conventional assembled apparatus for thermal dissipation in prior art.
Figure 2:
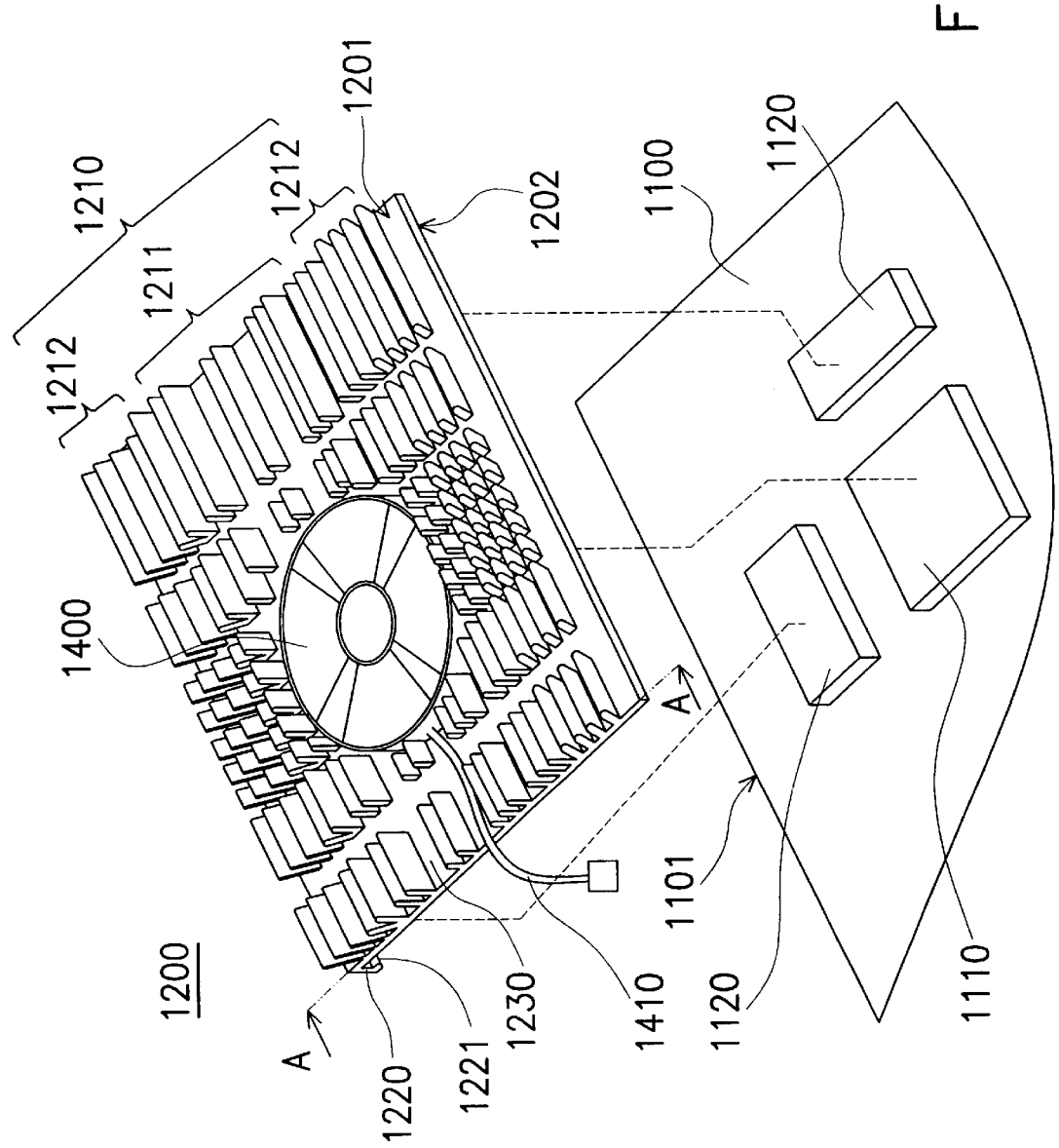
FIG. 2 is a schematic drawing of an integrated apparatus for thermal dissipation in accordance with the preferred embodiment.

FIG. 2 is a schematic 3D diagram of an integrated apparatus for thermal dissipation in accordance with the preferred embodiment. An integrated apparatus for thermal dissipation 1200 comprising a baseboard 1230, a first side 1201, and a second side 1202 and the first side 1201 contains multiple thermal dissipating fins 1210. The thermal dissipating fins 1210 form an angle of which the set of first fins 1211 is perpendicular to the first side and the set of second fins 1212 is not directly perpendicular to the first side. The set of second fins 1212 has a slant design, which greatly increases the surface area over a conventional perpendicular fin design to improve thermal dissipation and furthermore to create a visual layering effect.

An active type fan 1400 is located in the center of the first side 1201 and it is connected to the display card 1100 for power via a power cable 1410. The amount of wind generated by the fan is enough to carry away the surface heat collected in the heat sink 1200 and both the set of first fins 1211 and the set of second fins 1212 to improve the rate of thermal dissipation.

When the integrated apparatus for thermal dissipation 1200 is attached to the display card 1100 by a buckling structure (not shown), the second side 1202 is in contact with both the display chip 1110 and memory chips 1120 of the display card 1100 so the integrated apparatus for thermal dissipation 1200 carries out the thermal dissipation of both the display chip 1110 and memory chips 1120 simultaneously. Also when the integrated apparatus for thermal dissipation 1200 is attached onto the display card 1100, the entire area including the display chip 1110 and the memory chip 1120 is covered.

Figure 3:
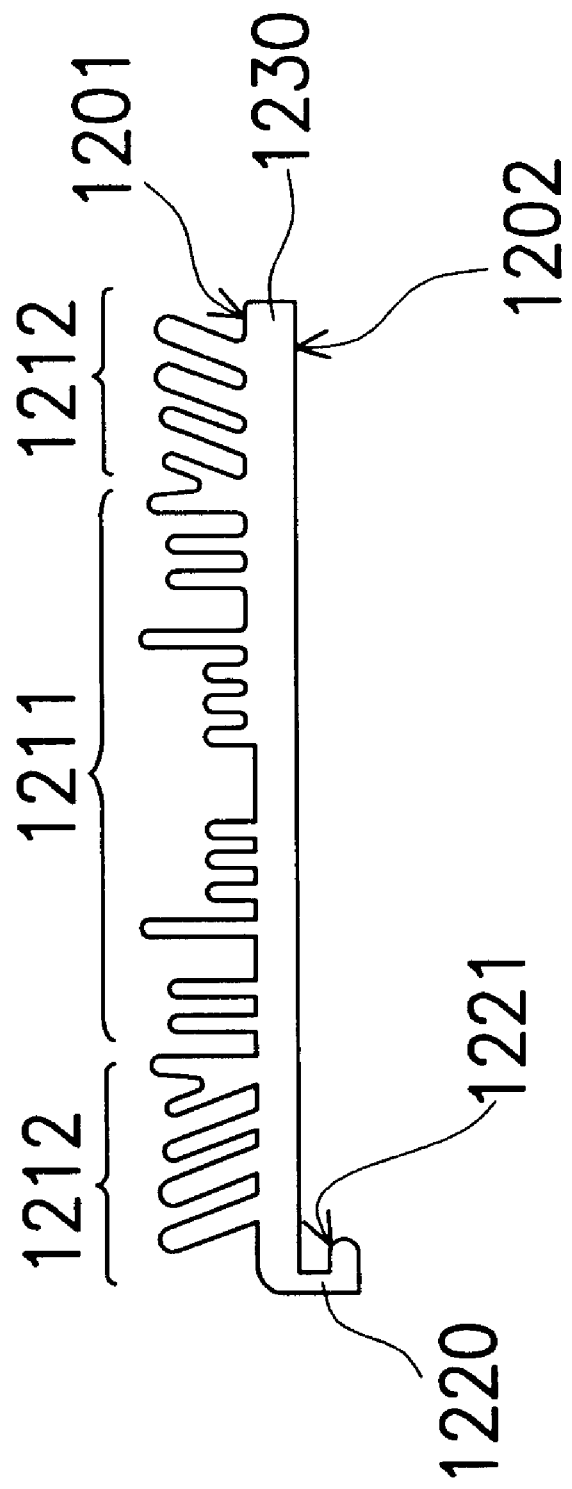
FIG. 3 is a schematic cross-sectional view of an integrated apparatus for thermal dissipation in the A—A direction in accordance with the preferred embodiment.

FIG. 3 is the schematic sectional view in the A—A direction in accordance to the preferred embodiment. An integrated apparatus for thermal dissipation 1200 has a baseboard 1230 and a board hook 1220 on one side of the baseboard 1230 for attaching the integrated apparatus for thermal dissipation 1200 to the edge 1101 of the display card 1100. This attachment decreases the gap between the heat generating components (display chip 1110 and memory chips 1120) and the apparatus for thermal dissipation 1200; and to prevent bad contact between the surface of the heat generating components and the integrated apparatus for thermal dissipation 1200 due to board bending and also due to vibration. Furthermore, the board hook 1220 has a slant edge 1221, which simplifies the worker's installation and improves performance.

Furthermore, the baseboard 1230 of the integrated apparatus for thermal dissipation 1200 is made of high thermal conductive material such as high thermal conductive metal, which includes aluminum having a high thermal conductive coefficient.

The sets of first and second fins are manufactured for example by aluminum pressing the fins and the baseboard 1230 together as an integrated body. Furthermore the board hook is manufactured for example by pressing the hook and the baseboard together as an integrated body.

The fan 1400 is an active type fan and its direction is parallel to the first side 1201.

According to the embodiment, these invention posses at least the following benefits:

1. Integration of the thermal dissipation of both the display chip and the memory chips by having one unit replacing the multiple heat sink unit, which simplifies installation and improves thermal dissipation of the entire system.
2. The set of second fins has a slant design, which improves surface area for thermal dissipation for improving thermal dissipation.
3. A board hook is located on one side of the heat sink for attaching to the display card to minimize the gap between the heat generating components (display chip and memory chips) and the integrated apparatus for thermal dissipation; and also prevent bad contact between the surface of the heat generating components and the integrated apparatus for thermal dissipation due to board bending. The board hook eliminates the thermal conductive epoxy adhesive method to prevent detachment due to vibration and reduced installation time. Furthermore, a board hook has a slant edge for simplifying worker's installation.
4. An active type fan is located in the center of the integrated apparatus for thermal dissipation. By combining an active type fan with the large surface area of the heat sink, the integrated apparatus for thermal dissipation efficiently carries away the surface heat of the heat sink to improve thermal dissipation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated apparatus for thermal dissipation which is suitable for thermal dissipation of a display chip and a memory chip on a display card, the apparatus comprising:
    a baseboard having a first side and a second side, which is opposite to the first side, wherein the second side is in contact with the display chip and the memory chip simultaneously;

a plurality of first fins and a plurality of second fins, which are located on the first side, wherein the plurality of first fins is perpendicular to the first side and the plurality of second fins forms an angle other than 90 degrees with the first side; and a board hook is located on an edge of the baseboard and clamps on the edge of the display card.

2. The apparatus of claim 1, wherein the baseboard, the plurality of first fins, and the plurality of second fins are made of a material including a high conductive metal.

3. The apparatus of claim 2, wherein the high conductive metal includes aluminum.

4. The apparatus of claim 1, wherein the plurality of first fins and the plurality of second fins are manufactured together with the baseboard by an aluminum integrated pressing method.

5. The apparatus of claim 1, wherein the board hook is manufactured together with the baseboard by an integrated pressing method.

6. The apparatus of claim 1, wherein the board hook includes a slanted edge for clamping onto the edge of the display card.

7. The apparatus of claim 1, further comprising a fan located on the first side between the plurality of first fins and the plurality of second fins.

8. The apparatus of claim 7, wherein the fan comprises an active type fan.

9. The apparatus of claim 7, wherein the fan further includes a power cord that connects directly to a display card to get power.

10. An integrated apparatus for thermal dissipation which is suitable for thermal dissipation of a display chip and a memory chip on a display card, the apparatus comprising:

a metal plate having a first side and a second side, which is opposite to the first side, wherein an area of the metal plate at least covers the display chip and the memory chip; and a plurality of first fins and a plurality of second fins, which are located on the first side, wherein the plurality of first fins is perpendicular to the first side and the plurality of second fins forms an angle other than 90 degrees with the first side.

11. The apparatus of claim 10, further comprising a board hook located on an edge of the metal plate for clamping onto the edge of the display card.

12. The apparatus of claim 10, wherein the metal plate, the plurality of first fins and the plurality of second of fins include aluminum.

13. The apparatus of claim 12, wherein a plurality of first fins and a plurality of second fins are manufactured together with the plate by an integrated pressing method.

14. The apparatus of claim 11, wherein the board hook is manufactured together with a plate by an integrated pressing method.

15. The apparatus of claim 11, wherein the board hook includes a slanted edge for clamping onto the edge of a display card.

* * * * *